United States Patent
Takahara et al.

(10) Patent No.: US 11,875,968 B2
(45) Date of Patent: Jan. 16, 2024

(54) HIGH FREQUENCY POWER SOURCE ALLOWING ARBITRARY SETTING OF TEMPORAL CHANGE PATTERN FOR HIGH FREQUENCY OUTPUT POWER

(71) Applicant: Adtec Plasma Technology Co., Ltd., Hiroshima (JP)

(72) Inventors: Toshihiro Takahara, Hiroshima (JP); Takamichi Kishira, Hiroshima (JP); Katsunori Tanaka, Hiroshima (JP)

(73) Assignee: Adtec Plasma Technology Co., Ltd., Hiroshima (JP)

( * ) Notice: Subject to any disclaimer, the term of this patent is extended or adjusted under 35 U.S.C. 154(b) by 309 days.

(21) Appl. No.: 17/533,037

(22) Filed: Nov. 22, 2021

(65) Prior Publication Data
US 2022/0293393 A1    Sep. 15, 2022

(30) Foreign Application Priority Data

Mar. 15, 2021 (JP) ................................. 2021-041256

(51) Int. Cl.
*H01J 37/32* (2006.01)
*H05H 1/46* (2006.01)

(52) U.S. Cl.
CPC .. *H01J 37/32036* (2013.01); *H01J 37/32045* (2013.01); *H01J 37/32935* (2013.01); *H05H 1/46* (2013.01)

(58) Field of Classification Search
None
See application file for complete search history.

(56) References Cited

U.S. PATENT DOCUMENTS 10,269,540 B1 *  4/2019  Carter ............... H01J 37/32183
2020/0098546 A1 *  3/2020  Takahara ................. H03H 7/38

FOREIGN PATENT DOCUMENTS

JP    6497724 B1    4/2019

* cited by examiner

*Primary Examiner* — Dedei K Hammond
(74) *Attorney, Agent, or Firm* — Hodgson Russ LLP

(57) ABSTRACT

Provided is a high frequency power source allowing the user to arbitrarily set a temporal change pattern for the value of high frequency power to be outputted. A high frequency power source 10A according to the present invention includes an output portion 20 configured to output high frequency power to a load 40 via an impedance matching circuit 30, a data storage portion 13A configured to store command data created by a user, and a control portion 12A configured to control the output portion 20 and the impedance matching circuit 30 on the basis of the command data stored in the data storage portion 13A. Each of a plurality of records that constitute the command data includes power command data about a value of high frequency power to be outputted and matching operation command data about whether to activate the impedance matching circuit 30, and the control portion sends a power signal, which is generated on the basis of the power command data, to the output portion and a synchronization signal, which is generated on the basis of the matching operation command data, to the impedance matching circuit.

7 Claims, 9 Drawing Sheets

| RECORD NO. | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| POWER [%] | 70.0 | 80.0 | 87.3 | 90.0 | 87.3 | 80.0 | 70.0 | 60.0 | 52.7 | 50.0 | 52.7 | 60.0 | 70.0 | 80.0 | 87.3 | 90.0 |
| MATCHING OPERATION | 0 | 0 | 1 | 1 | 1 | 0 | 0 | 0 | 0 | 0 | 0 | 0 | 0 | 0 | 1 | 1 |

| RECORD NO. | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| POWER [%] | 70.0 | 70.0 | 70.0 | 70.0 | 70.0 | 80.0 | 90.0 | 90.0 | 90.0 | 90.0 | 90.0 | 90.0 | 90.0 | 75.0 | 60.0 | 60.0 |
| MATCHING OPERATION | 0 | 0 | 0 | 0 | 0 | 0 | 0 | 1 | 1 | 1 | 1 | 1 | 1 | 0 | 0 | 0 |

| RECORD NO. | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| POWER [%] | 70.0 | 70.0 | 70.0 | 70.0 | 70.0 | 80.0 | 90.0 | 90.0 | 90.0 | 90.0 | 90.0 | 90.0 | 90.0 | 75.0 | 60.0 | 60.0 |
| MATCHING OPERATION | 0 | 0 | 0 | 0 | 0 | 0 | 0 | 1 | 1 | 1 | 1 | 1 | 1 | 0 | 0 | 0 |
| COOPERATION | 0 | 0 | 0 | 0 | 0 | 0 | 1 | 0 | 0 | 0 | 0 | 0 | 0 | 1 | 0 | 0 |

(PRIOR ART)

HIGH FREQUENCY POWER SOURCE ALLOWING ARBITRARY SETTING OF TEMPORAL CHANGE PATTERN FOR HIGH FREQUENCY OUTPUT POWER

TECHNICAL FIELD

The present invention relates to a high frequency power source configured to supply high frequency power to a load via an impedance matching circuit whose circuit constants are changed.

BACKGROUND ART

Semiconductor manufacturing steps, such as etching and thin-film formation, use a plasma treatment device and a high frequency power system configured to supply high frequency power to the plasma treatment device. The high frequency power system typically has the function of achieving an impedance match with the plasma treatment device in order to stably and efficiently supply power to the plasma treatment device.

FIG. 9 illustrates a high frequency power system 100 described in Patent Document 1, as an example of a system with an impedance matching function. As shown in the figure, the high frequency power system 100 includes a high frequency power source 101, a matching device 102, and an impedance matching circuit 103. The matching device 102 is configured to change an oscillation frequency of the high frequency power source 101 in accordance with predetermined rules, depending on an impedance matching condition between the high frequency power source 101 and a load 40 (a plasma treatment device). Moreover, the impedance matching circuit 103 includes passive elements whose constants are mechanically or electrically changed.

The high frequency power system 100 can combine impedance matching which offers a fast matching speed but a narrow matching range, as achieved by changing the oscillation frequency, and impedance matching which offers a wide matching range but a slow matching speed, as achieved by changing the constants.

It should be noted that the high frequency power source 101 and the matching device 102, as shown in FIG. 9, are often housed in the same casing. Accordingly, these elements will be collectively referred to herein as the "high frequency power source".

PRIOR ART DOCUMENT

Patent Document

Patent Document 1: Japanese Patent No. 6497724

DISCLOSURE OF THE INVENTION

Problems to be Solved by the Invention

Some of such high frequency power sources allow the amplitude of high frequency power (referred to below as the "value of high frequency power") to change over time in a preset simple temporal change pattern selected by the user from among some options (note that the "value of high frequency power" is not an instantaneous value). However, to the knowledge of the Applicant, no high frequency power source allows the user to arbitrarily set a temporal change pattern for the value of high frequency power to be outputted.

The present invention has been made in view of the above situation, and a problem thereof is to provide a high frequency power source allowing the user to arbitrarily set a temporal change pattern for the value of high frequency power to be outputted.

Solution to the Problems

To solve the above problem, the present invention provides a high frequency power source outputting high frequency power to a load via an impedance matching circuit whose circuit constants are changed, the source includes an output portion configured to output the high frequency power, a data storage portion configured to store command data created by a user, and a control portion configured to control the output portion and the impedance matching circuit on the basis of the command data stored in the data storage portion, the command data consists of a plurality of records, each of the records includes power command data about a value of the high frequency power to be outputted and matching operation command data about whether to activate the impedance matching circuit, and the control portion sends a power signal to the output portion and a synchronization signal to the impedance matching circuit, the power signal being generated on the basis of the power command data in the records, the synchronization signal being generated on the basis of the matching operation command data in the records.

In the high frequency power source, each of the records may further include cooperation command data for causing at least one additional high frequency power source to work in cooperation with the high frequency power source, and the control portion may send a cooperation signal to the at least one additional high frequency power source, the cooperation signal being generated on the basis of the cooperation command data in the records.

In the high frequency power source, the data storage portion may further store a reference power value for the high frequency power. In this case, the power command data may represent a value of the high frequency power to be outputted, as a percentage relative to the reference power value.

In the high frequency power source, the matching operation command data may indicate whether to acquire information about an impedance matching condition.

In the high frequency power source, the data storage portion may store a plurality of sets of command data created by the user. In this case, the control portion preferably controls the output portion and the impedance matching circuit on the basis of a user specified range of the records that constitute the plurality of sets of command data.

In the high frequency power source, the output portion may include a detector configured to detect traveling and reflected wave power values. In this case, the control portion may change the power signal on the basis of either or both the traveling and reflected wave power values detected by the detector.

The high frequency power source can be used, for example, for outputting high frequency power to a plasma treatment device serving as a load, but the use thereof is not limited to this.

Effect of the Invention

The present invention renders it possible to provide a high frequency power source allowing the user to arbitrarily set a temporal change pattern for the value of high frequency power to be outputted.

MODES FOR CARRYING OUT THE INVENTION

Hereinafter, embodiments of a high frequency power source according to the present invention will be described with reference to the accompanying drawings.

First Embodiment

Figure 1:
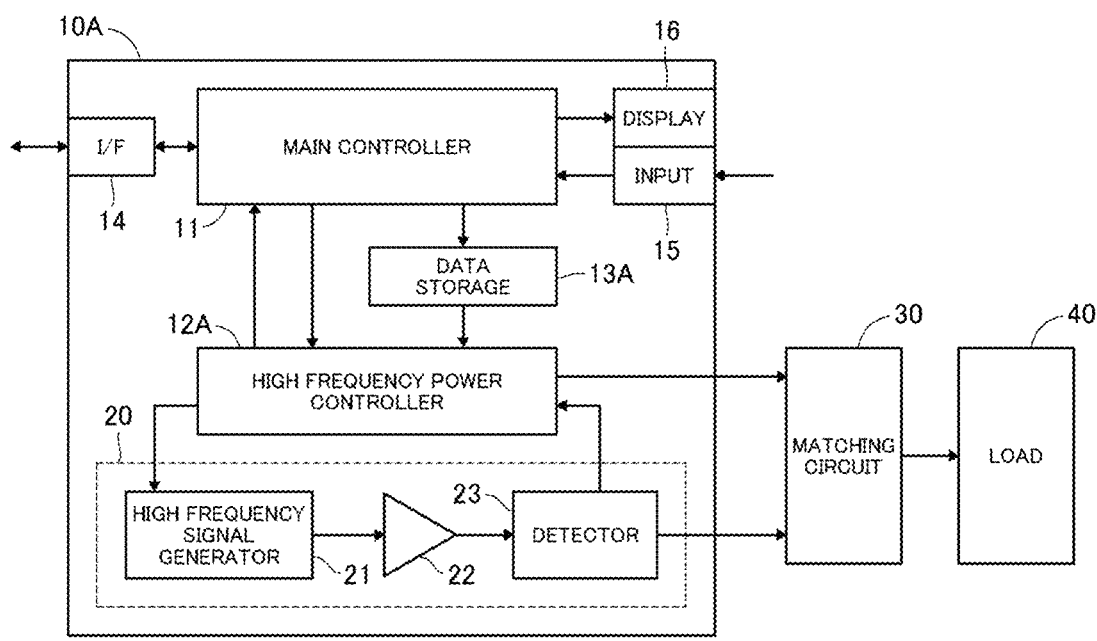
FIG. 1 is a block diagram illustrating a high frequency power source according to a first embodiment of the present invention.

FIG. 1 illustrates a high frequency power source 10A according to a first embodiment of the present invention. The high frequency power source 10A is intended to output high frequency power to a load 40 via an impedance matching circuit 30, and includes a main control portion 11, a high frequency power control portion 12A, a data storage portion 13A, an external interface portion 14, an input portion 15, a display portion 16, and an output portion 20, as shown in the figure. In the present embodiment, the frequency of the high frequency power is set at 13.56 MHz, but this is merely illustrative.

Figure 2A:
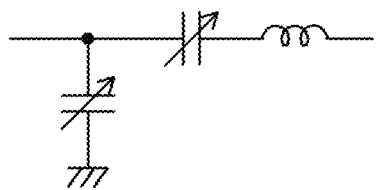
FIGS. 2(A) to 2(D) are circuit diagrams each illustrating a specific configuration example of an impedance matching circuit.

The impedance matching circuit 30 includes two capacitors whose constants (capacitances) can be changed, and an inductor, as shown in FIG. 2(A). The constants of the capacitors are changed by a matching condition acquisition portion and a control portion, both of which are included in the impedance matching circuit 30 but not shown in the figure, such that an impedance mismatch between the high frequency power source 10A and the load 40 is improved. This change is made mechanically by using an electric actuator or suchlike, but this is merely illustrative, and such a change may be made electrically.

Figure 2B:
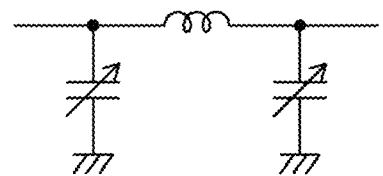
Figure 2C:
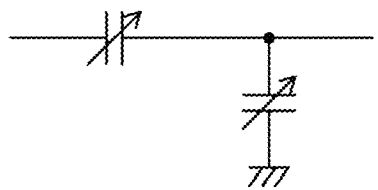
Figure 2D:
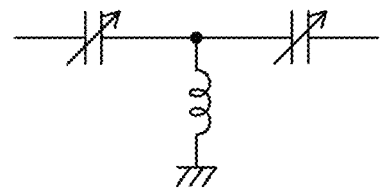

The configuration of the impedance matching circuit 30 is not limited to that shown in FIG. 2(A) and may be any of those shown in FIGS. 2(B) to 2(D). The configuration of the impedance matching circuit 30 is suitably selected depending on the configuration of the load 40 and other factors.

The load 40 is a plasma treatment device (more specifically, a coil wound around a plasma chamber included in the plasma treatment device) for use in semiconductor manufacturing steps, such as etching and thin-film formation. The impedance of the load 40 varies every moment depending on the type and amount of gas introduced into the plasma chamber and other factors.

The main control portion 11 is a computer unit configured to control and manage the entire high frequency power source 10A. The main control portion 11 is connected to the high frequency power control portion 12A, the data storage portion 13A, the external interface portion 14, the input portion 15, and the display portion 16.

When the user inputs command data to the main control portion 11 via the input portion 15, which consists of a group of keys, or via an external device connected to the external interface portion 14, the main control portion 11 transfers the command data to the data storage portion 13A, which is non-volatile or volatile memory. The data storage portion 13A stores the command data transferred thereto. Moreover, upon reception of a user command to start outputting, inputted via the input portion 15, or upon reception of a trigger from an external device connected to the external interface portion 14, the main control portion 11 sends an output start signal to the high frequency power control portion 12A.

In addition, the main control portion 11 can cause the display portion 16, which is a liquid crystal display or suchlike, to display the operation status of the high frequency power source 10A and various types of information sent from the high frequency power control portion 12A. Moreover, the main control portion 11 can also send signals concerning the operation status of the high frequency power source 10A and other information to an external device via the external interface portion 14.

Figures 3A, 3B:
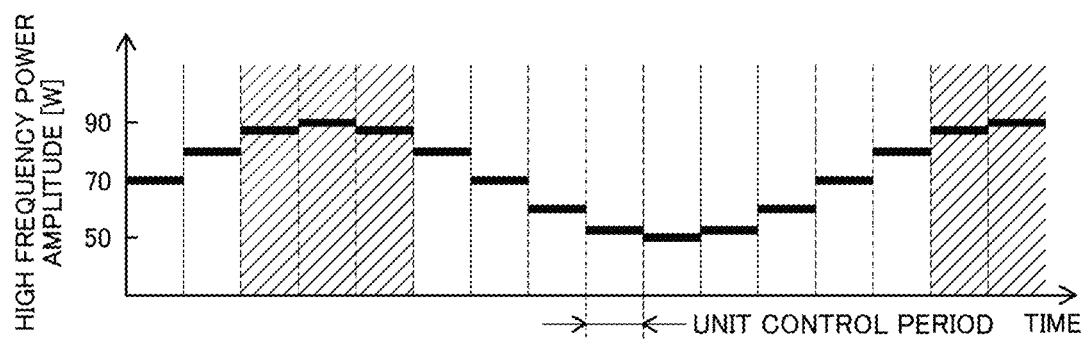
FIG. 3(A) provides an example of command data in the first embodiment of the present invention.
FIG. 3(B) is a graph showing control results based on FIG. 3(A).

The command data that the user stores in the data storage portion 13A is created by the user himself/herself and consists of a plurality of records, as shown in FIG. 3(A). Each record includes power command data about the value of high frequency power to be outputted (middle row) and matching operation command data about whether to activate the impedance matching circuit 30 (bottom row).

In the case where the user sets a reference power value in advance, i.e., in the case where the data storage portion 13A has the reference power value stored therein, the power command data can represent "the value of high frequency power to be outputted, as a percentage relative to the reference power value". For example, in the case where the reference power value is set at 100 W, when the value of the high frequency power is desired to change over time as follows: 70 W→80 W→87.3 W→90 W→87.3 W→80 W→70 W→60 W . . . (see FIG. 3(B)), the power command data in records Nos. 1, 2, 3, 4, 5, 6, 7, 8, etc., represent 70%, 80%, 87.3%, 90%, 87.3%, 80%, 70%, 60%, etc., respectively.

It should be noted that the unit control periods shown in FIG. 3(B) correspond to the records shown in FIG. 3(A). The unit control period is, for example, 1 μs.

The high frequency power control portion 12A is a computer unit and corresponds to the "control portion" of the present invention. Upon reception of an output start signal from the main control portion 11, the high frequency power control portion 12A controls the output portion 20 to output high frequency power to the load 40, in accordance with the command data stored in the data storage portion 13A. More specifically, upon reception of the output start signal, the high frequency power control portion 12A generates a power signal based on power command data in a plurality of records included in the command data, and sends the signal to the output portion 20.

Figure 4:
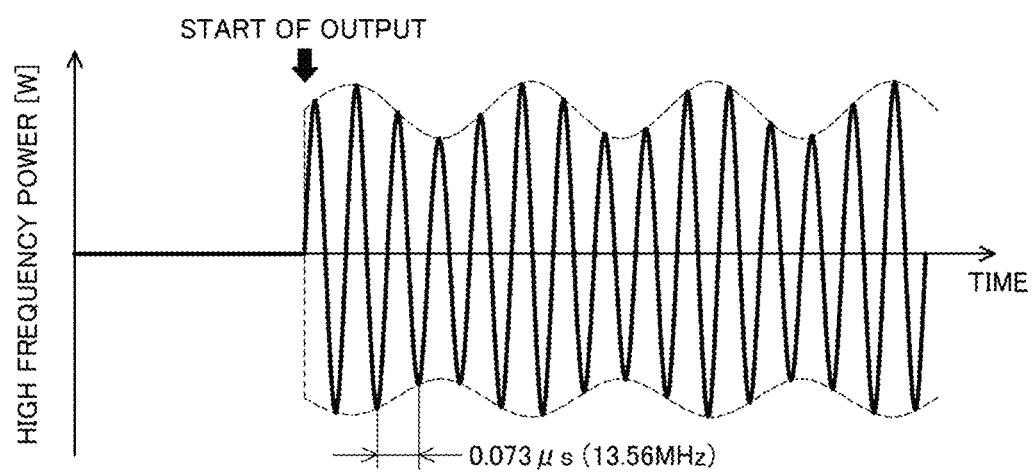
FIG. 4 is a waveform chart showing an example of high frequency power outputted by the high frequency power source according to the first embodiment of the present invention.

The output portion 20 includes a high frequency signal generator 21, an amplifier 22, and a detector 23, which is a directional coupler. The high frequency signal generator 21 generates a 13.56 MHz high frequency signal. In this case, the high frequency signal generator 21 causes the amplitude of the high frequency signal to change over time in accordance with the power signal. The amplifier 22 amplifies the high frequency signal generated by the high frequency signal generator 21, with a predetermined gain, and outputs the amplified high frequency signal (i.e., high frequency power) to the impedance matching circuit 30 via the detector 23. In the case where the data storage portion 13A has the above command data stored therein, the output portion 20 outputs high frequency power whose value (amplitude) changes in a generally sinusoidal manner (see FIG. 4). The detector 23 detects travelling and reflected wave power values, and sends a signal to the high frequency power control portion 12A in accordance with the detection results.

Upon reception of the signal from the detector 23, concerning the travelling and reflected wave power values, the high frequency power control portion 12A can change the power signal on the basis of either or both the travelling and reflected wave power values. For example, when the reflected wave power value exceeds a predetermined upper limit, the high frequency power control portion 12A changes the power signal so as to lower the high frequency power that is being supplied to the load 40.

The various types of information sent from the high frequency power control portion 12A to the main control portion 11 may include the traveling and reflected wave power values.

In this manner, in the present embodiment, the user can arbitrarily set the temporal change (waveform) pattern for the value of the high frequency power that is to be outputted by the high frequency power source 10A.

Upon reception of the output start signal from the main control portion 11, the high frequency power control portion 12A also controls the impedance matching circuit 30 in accordance with the command data stored in the data storage portion 13A. More specifically, upon reception of the output start signal, the high frequency power control portion 12A generates a synchronization signal based on matching operation command data in a plurality of records included in the command data, and sends the signal to the impedance matching circuit 30.

As described earlier, the impedance matching circuit 30 acquires information about an impedance matching condition between the high frequency power source 10A and the load 40, and when there is a mismatch, the impedance matching circuit 30 mechanically or electrically changes the constants so as to improve the mismatch. During unit control periods that correspond to records for which the matching operation command data is set at "0", the impedance matching circuit 30 continues to change the constants on the basis of the latest acquired information about the impedance matching condition, without further acquiring information about the impedance matching condition, in accordance with the synchronization signal from the high frequency power control portion 12A.

For example, upon reception of a synchronization signal generated on the basis of the command data shown in FIG. 3(A), the impedance matching circuit 30 acquires information about the matching condition during the periods that correspond to records Nos. 3 to 5 and Nos. 15 and 16, but does not acquire information about the matching condition during the other periods. Accordingly, during the periods that correspond to records Nos. 6 to 14, the impedance matching circuit 30 continues to change the constants on the basis of the matching condition information acquired during the periods that correspond to records Nos. 3 to 5.

From the viewpoint of improving a mismatch with high accuracy, the impedance matching circuit 30 preferably acquires information about the matching condition at a time when the value of the high frequency power that is being outputted by the high frequency power source 10A is as constant as possible and relatively high. The present embodiment allows arbitrary setting of the time at which the impedance matching circuit 30 acquires information about the matching condition, as well as allowing arbitrary setting of the temporal change (waveform) pattern for the value of the high frequency power that is to be outputted by the high frequency power source 10A. That is, the present embodiment allows the user to configure the impedance matching circuit 30 to perform highly accurate impedance matching.

Figures 5A, 5B:
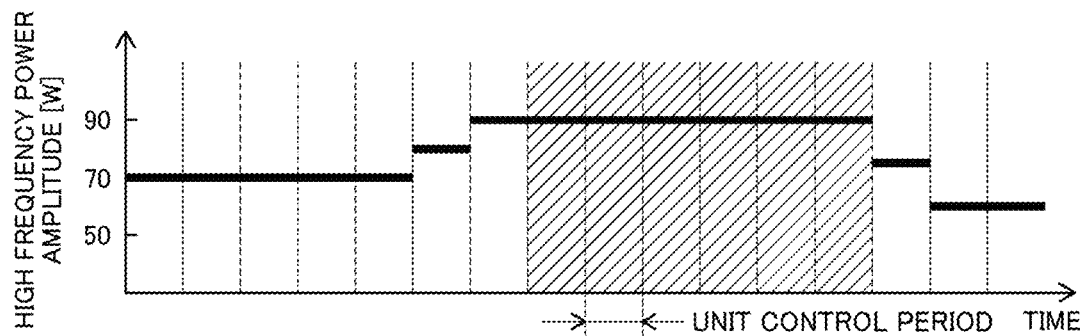
FIG. 5(A) provides another example of command data in the first embodiment of the present invention.
FIG. 5(B) is a graph showing control results based on FIG. 5(A).
Figure 6:
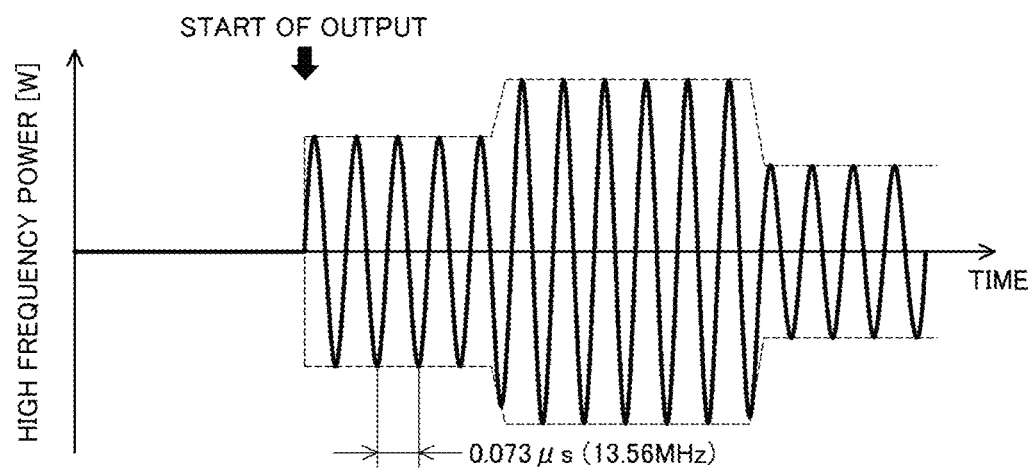
FIG. 6 is a waveform chart showing another example of high frequency power outputted by the high frequency power source according to the first embodiment of the present invention.

In the case where the value of the high frequency power that is to be outputted is desired to change stepwise as shown in FIG. 6, the user may store, for example, command data as shown in FIG. 5(A) to the data storage portion 13A. In this case, from the viewpoint of improving a mismatch with high accuracy, it is preferable to acquire information about the matching condition during the periods that correspond to records Nos. 8 to 13 in which the value of the high frequency power is constant and relatively high (see FIGS. 5(A) and 5(B)).

Second Embodiment

Figure 7:
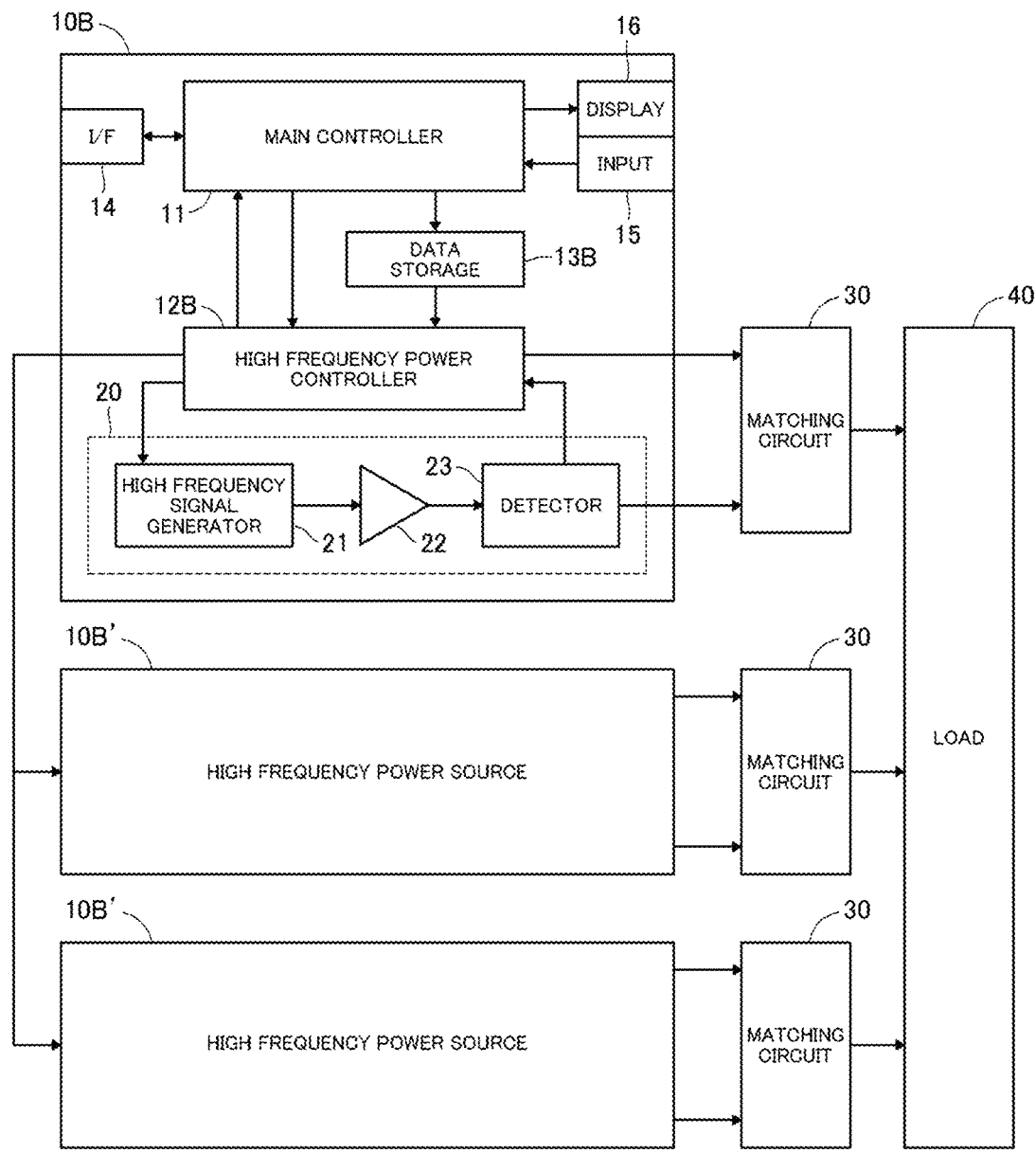
FIG. 7 is a block diagram illustrating a high frequency power source according to a second embodiment of the present invention.

FIG. 7 illustrates a high frequency power source 10B according to a second embodiment of the present invention. The high frequency power source 10B is designed to supply high frequency power to the load 40 in cooperation with two additional high frequency power sources 10B'. The high frequency power sources 10B and 10B' are the same as the high frequency power source 10A except that the high frequency power control portion 12A is replaced by a high frequency power control portion 12B, and the data storage portion 13A is replaced by a data storage portion 13B.

Figures 8A, 8B:
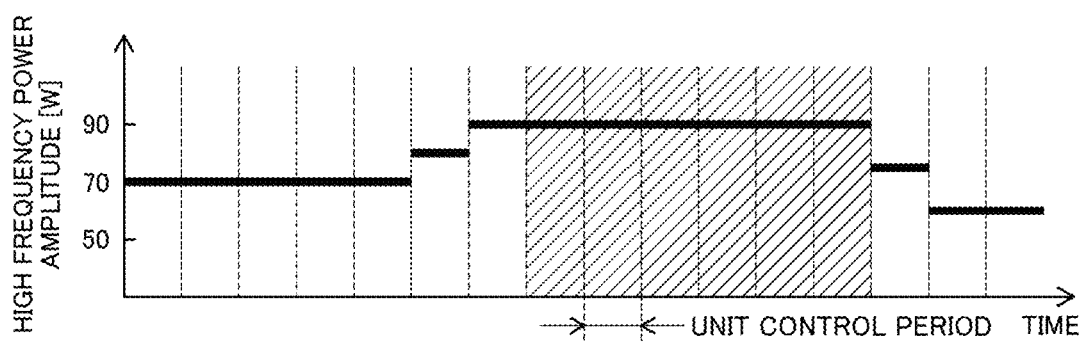
FIG. 8(A) provides an example of command data in the second embodiment of the present invention.
FIG. 8(B) is a graph showing control results based on FIG. 8(A).
Figure 9:
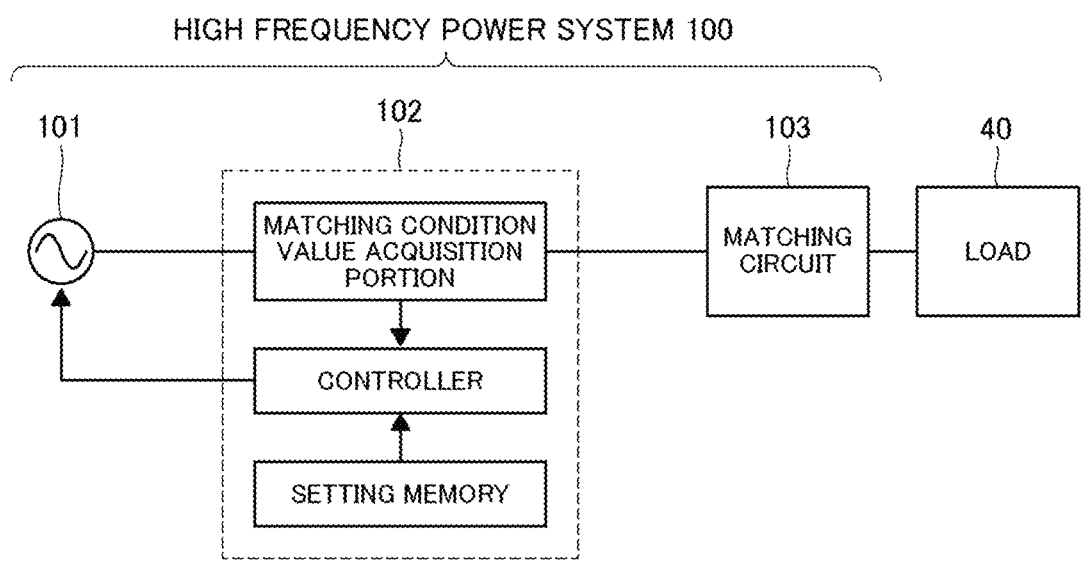
FIG. 9 is a block diagram illustrating a conventional high frequency power system.

In addition to the power command data about the value of high frequency power to be outputted and the matching operation command data about whether to activate the impedance matching circuit 30, each record in command data that the user stores in the data storage portion 13B includes cooperation command data for causing the additional high frequency power sources 10B' to work in cooperation with the high frequency power source 10B, as shown in FIG. 8(A).

The high frequency power control portion 12B generates the power signal and the synchronization signal on the basis of the power command data and the matching operation command data in a plurality of records included in the command data, and also generates a cooperation signal on the basis of the cooperation command data in a plurality of records included in the command data. Moreover, the high frequency power control portion 12B sends the generated cooperation signal to the high frequency power control portions 12B of the additional high frequency power sources 10B'.

In an example of the command data, as shown in FIG. 8(A), the cooperation command data is set at "1" for records Nos. 7 and 14. Accordingly, after the additional high frequency power sources 10B' receive the cooperation signal, the additional high frequency power sources 10B' can switch operation modes at times when the high frequency power source 10B provides outputs in accordance with records Nos. 7 and 14. For example, the additional high frequency power sources 10B' can output high frequency power only when the value of the high frequency power that is to be outputted by the high frequency power source 10B is 90 W. Alternatively, the additional high frequency power sources 10B' can change respective high frequency output power values depending on whether the value of the high frequency power that is to be outputted by the high frequency power source 10B is 90 W.

Variant

While the high frequency power source according to the present invention has been described above in conjunction with the first and second embodiments, the configuration of the high frequency power source according to the present invention is not limited to these embodiments.

For example, the data storage portions 13A and 13B may have a plurality of sets of command data α, β, etc., stored therein. In such a case, for example, the high frequency power control portion 12A (or 12B) sends power signals generated on the basis of all records in command data α to the output portion 20 and then power signals generated on the basis of some records in command data β to the output portion 20, and thereafter the high frequency power control portion 12A (or 12B) can resend the power signals generated on the basis of all records in command data α to the output portion 20. It is preferable for the user to be able to designate command data, one or more records in the command data, and the order of using the records, via the input portion 15 or an external device connected to the external interface portion 14.

The output portion 20 may include a high frequency signal generator configured to output a high frequency signal with a constant amplitude and an amplifier whose gain changes in accordance with the power signal.

The detector 23 is not limited to a directional coupler and may be configured to detect traveling and reflected wave power values on the basis of a voltage, a current, and a phase difference therebetween.

Moreover, the power command data in the command data may represent a target power value (e.g., 70 W, 80 W, 87.3 W, etc.), rather than a percentage relative to a reference power value (e.g., 70%, 80%, 87.3%, etc.).

DESCRIPTION OF THE REFERENCE CHARACTERS 10A, 10B high frequency power source
11 main control portion
12A, 12B high frequency power control portion
13A, 13B data storage portion
14 external interface portion
15 input portion
16 display portion
20 output portion
21 high frequency signal generator
22 amplifier
23 detector
30 impedance matching circuit
40 load

The invention claimed is:

1. A high frequency power source outputting high frequency power to a load via an impedance matching circuit whose circuit constants are changed, the source comprising:
   an output portion configured to output the high frequency power;
   a data storage portion configured to store command data created by a user; and
   a control portion configured to control the output portion and the impedance matching circuit on the basis of the command data stored in the data storage portion, wherein,
   the command data consists of a plurality of records,
   each of the records includes power command data about a value of the high frequency power to be outputted and matching operation command data about whether to activate the impedance matching circuit, and
   the control portion sends a power signal to the output portion and a synchronization signal to the impedance matching circuit, the power signal being generated on the basis of the power command data in the records, the synchronization signal being generated on the basis of the matching operation command data in the records.

2. The high frequency power source according to claim 1, wherein,
   each of the records further includes cooperation command data for causing at least one additional high frequency power source to work in cooperation with the high frequency power source, and
   the control portion sends a cooperation signal to the at least one additional high frequency power source, the cooperation signal being generated on the basis of the cooperation command data in the records.

3. The high frequency power source according to claim 1, wherein,
   the data storage portion further stores a reference power value for the high frequency power, and
   the power command data represents a value of the high frequency power to be outputted, as a percentage relative to the reference power value.

4. The high frequency power source according to claim 1, wherein the matching operation command data indicates whether to acquire information about an impedance matching condition.

5. The high frequency power source according to claim 1, wherein,
   the data storage portion stores a plurality of sets of command data created by the user, and
   the control portion controls the output portion and the impedance matching circuit on the basis of a user specified range of the records that constitute the plurality of sets of command data.

6. The high frequency power source according to claim 1, wherein,
   the output portion includes a detector configured to detect traveling and reflected wave power values, and
   the control portion changes the power signal on the basis of either or both the traveling and reflected wave power values detected by the detector.

7. The high frequency power source according to claim 1, wherein the high frequency power is outputted to a plasma treatment device serving as the load.

* * * * *